(12) United States Patent
Hong

(10) Patent No.: US 7,238,617 B2
(45) Date of Patent: Jul. 3, 2007

(54) METHOD FOR FABRICATING SEMICONDUCTOR DEVICE TO MINIMIZE TERMINAL EFFECT IN ECP PROCESS

(75) Inventor: Ji Ho Hong, Suwon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 232 days.

(21) Appl. No.: 11/026,882

(22) Filed: Dec. 30, 2004

(65) Prior Publication Data
US 2005/0153548 A1    Jul. 14, 2005

(30) Foreign Application Priority Data
Dec. 31, 2003  (KR) ...................... 10-2003-0102199

(51) Int. Cl.
*H01L 21/44*  (2006.01)
(52) U.S. Cl. ...................... 438/687; 438/678; 438/660; 257/21.575
(58) Field of Classification Search ................. 438/687
See application file for complete search history.

(56) References Cited

U.S. PATENT DOCUMENTS

| | | | |
|---|---|---|---|
| 5,969,422 A * | 10/1999 | Ting et al. .................. 257/762 |
| 6,265,086 B1 * | 7/2001 | Harkness .................... 428/626 |
| 6,472,023 B1 * | 10/2002 | Wu et al. ................. 427/430.1 |
| 6,610,151 B1 | 8/2003 | Cohen | |
| 2003/0201536 A1 * | 10/2003 | Ueno ......................... 257/750 |

* cited by examiner

*Primary Examiner*—Walter Lindsay, Jr.
*Assistant Examiner*—Angel Roman
(74) *Attorney, Agent, or Firm*—Andrew D. Fortney

(57) ABSTRACT

A method for fabricating a semiconductor device to minimize a terminal effect in an ECP process is disclosed. The method for fabricating a semiconductor device to minimize a terminal effect in an ECP process, comprises depositing a barrier metallic layer on the top of a damascene pattern formed through an etching process, forming an Ag seed layer by employing a heating process for the reaction of the surface of the barrier metallic layer and a $NH_3$ solution of $AgNO_3$ and reductive materials in a reactor, plating a Cu layer by using the Ag seed layer through an ECP process and forming a Cu interconnect through an annealing process and a Cu CMP process.

The method for fabricating a semiconductor device according to the present invention provides the improvement of uniformity by forming a seed layer with low-resistivity regardless of a thin thickness in order to avoid a terminal effect in an ECP process.

10 Claims, 5 Drawing Sheets

METHOD FOR FABRICATING SEMICONDUCTOR DEVICE TO MINIMIZE TERMINAL EFFECT IN ECP PROCESS

BACKGROUND OF THE INVENTION

1. Field of the Invention

The present disclosure relates to a method for fabricating a semiconductor device and, more particularly, to a method for fabricating a semiconductor device to minimize a terminal effect for improving uniformity in an ECP process by forming a Ag seed layer with low-resistivity instead of a Cu seed layer.

2. Background of the Related Art

For a Cu interconnect formation by an Electro Chemical Plating (hereinafter referred to as "ECP") process, a seed layer with low-resistivity is generally required. A Cu seed layer by a PVD (Physical Vapor Deposition) process has been mainly used as the seed layer.

Considering the trend of diminution of the dimension of interconnects, as the degree of integration for a semiconductor device continuously increases, the thickness of the Cu seed layer should be decreased. Although the Cu seed layer is required to have low-resistivity, high-resistivity may be generated due to the low thickness of the Cu seed layer. Moreover, the uniformity of the Cu seed layer may be deteriorated by a terminal effect due to employing the ECP process for forming the Cu interconnect.

Particularly, the terminal effect makes it difficult to control the uniformity of a layer in a process for a large size wafer such as a 300 mm wafer instead of a 200 mm wafer. Thus the seed layer is required to have low-resistivity regardless of the diminution of the dimension of an interconnect.

U.S. Pat. No. 6,610,151, Uri Cohen, discloses an apparatus for depositing seed layers from the group of Cu, Ag or an alloy thereof on a substrate having narrow openings surrounded by a field.

SUMMARY OF THE INVENTION

The present invention is directed to a method for fabricating a semiconductor device to minimize a terminal effect in an ECP process that substantially obviates one or more problems due to limitations and disadvantages of the related art.

An object of the present invention is to minimize a terminal effect in an ECP process by forming a Ag seed layer with low-resistivity instead of a Cu seed layer.

To achieve these objects and other advantages and in accordance with the purpose of the invention, as embodied and broadly described herein, a method for fabricating a semiconductor device to minimize a terminal effect in an ECP process, comprises depositing a barrier metallic layer on the top of a damascene pattern formed through an etching process, forming an Ag seed layer by employing a heating process for the reaction of the surface of the barrier metallic layer and a $NH_3$ solution of $AgNO_3$ and reductive materials in a reactor, plating a Cu layer by using the Ag seed layer through an ECP process and forming a Cu interconnect through an annealing process and a Cu CMP process.

Preferably, the reductive materials and the $NH_3$ solution of $AgNO_3$ are provided by either a batch bath or a dispense method. The reductive materials preferably are sucrose.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Reference will now be made in detail to the preferred embodiments of the present invention.

Figure 1:
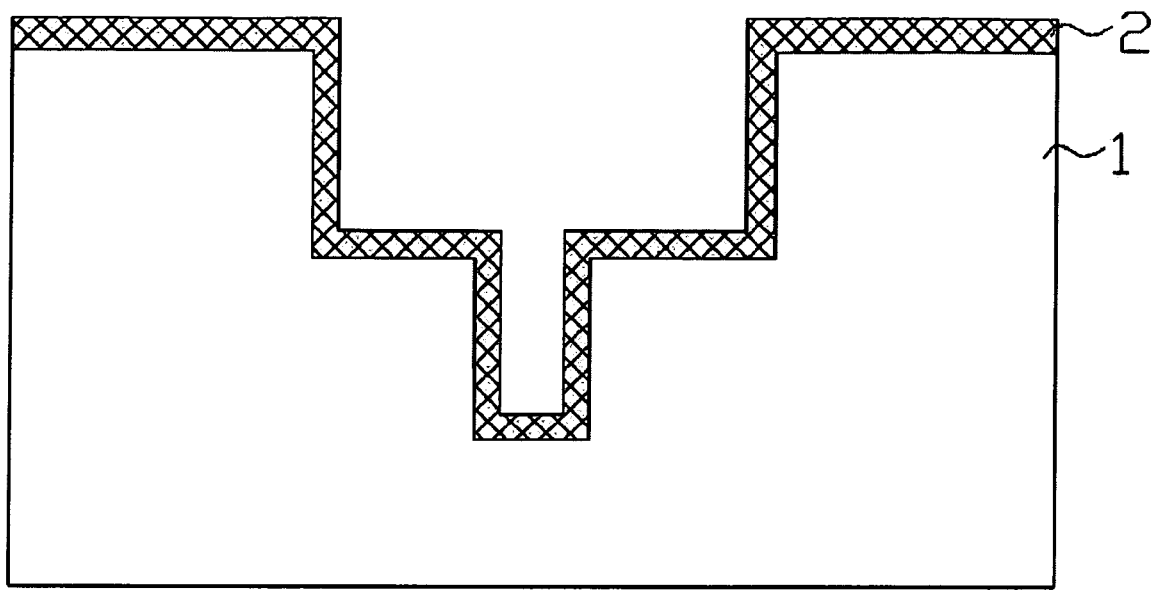
FIG. 1 schematically shows, in a cross-sectional view, a barrier metallic layer deposited on the top of a common damascene pattern.

Referring to FIG. 1, a barrier metallic layer 2 to deposit a seed layer is formed over a single damascene or a damascene pattern 1, which is formed through an etching process. According to the prior art, a shortcomings of the increase in resistivity of a Cu seed layer arises from the reduction of the thickness of the Cu seed layer.

Figure 2:
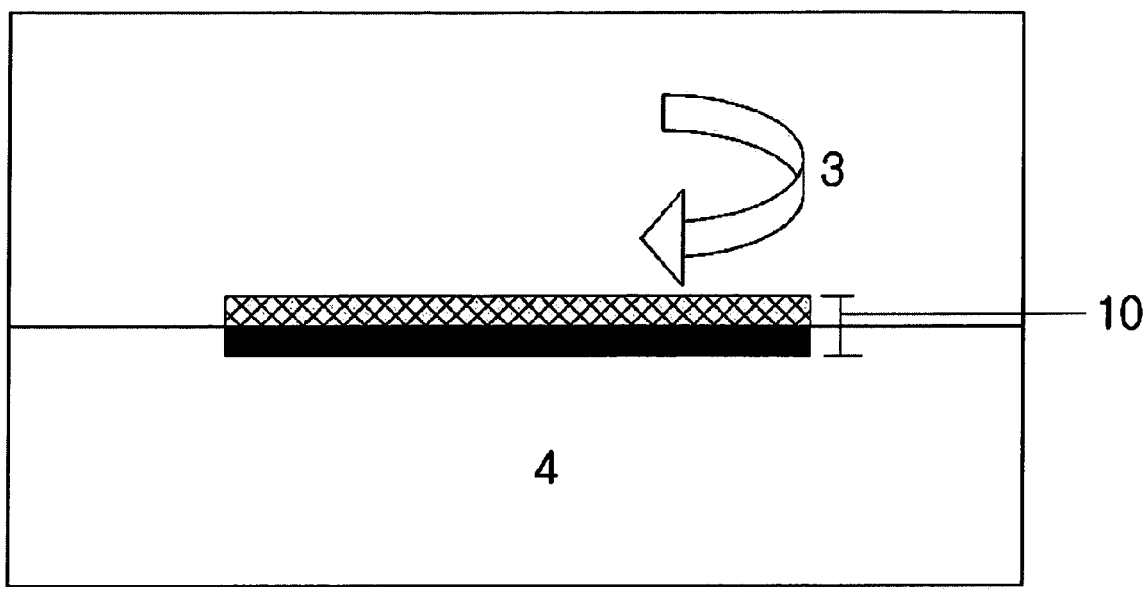
FIG. 2 and FIG. 3 schematically illustrate, in cross-sectional views, the method for fabricating a Ag seed layer by the sliver mirror reaction according to the present invention.
Figure 3:
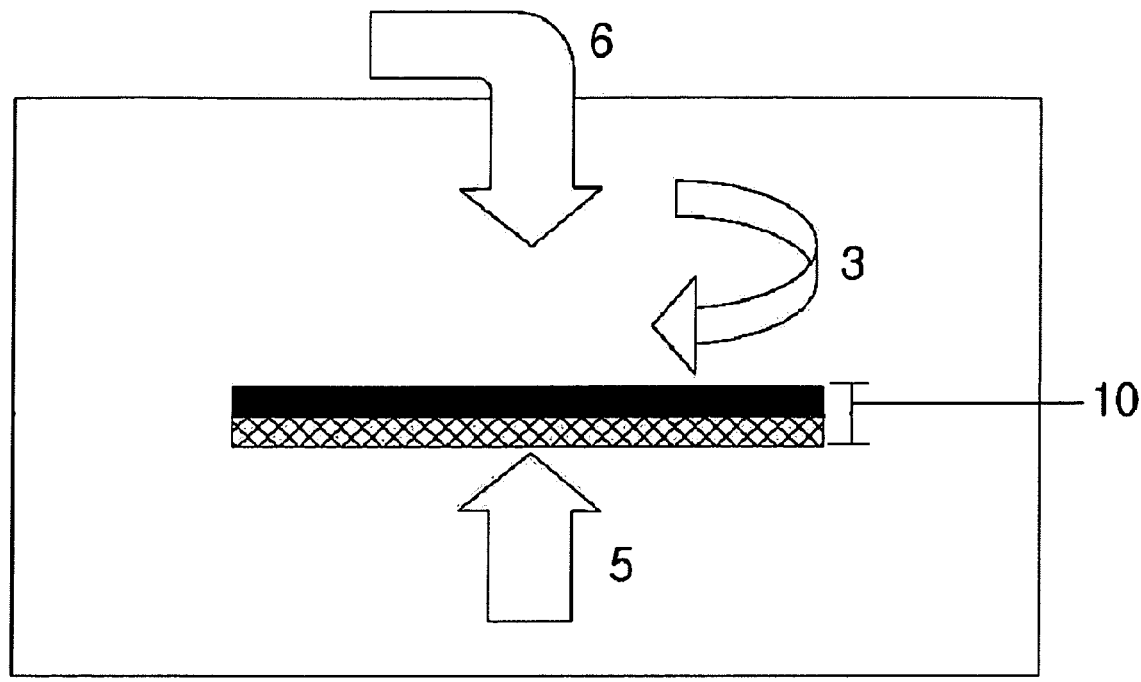

Referring to FIG. 2 and FIG. 3, a reactor and a predetermined solution 4 are prepared. Here, the predetermined solution 4 is preferably a mixture comprising an $NH_3$ solution of $AgNO_3$ and reductive materials such as sucrose for changing $Ag^+$ to Ag. Next, a heating process 5 is performed to form a Ag layer on the barrier metallic layer of a wafer 10. The wafer 10 may be rotated 3 with a predetermined RPM. The predetermined solution 4 may be provided by either a batch bath (as shown in FIG. 2) or a dispense method 6 (as shown in FIG. 3).

Figure 4:
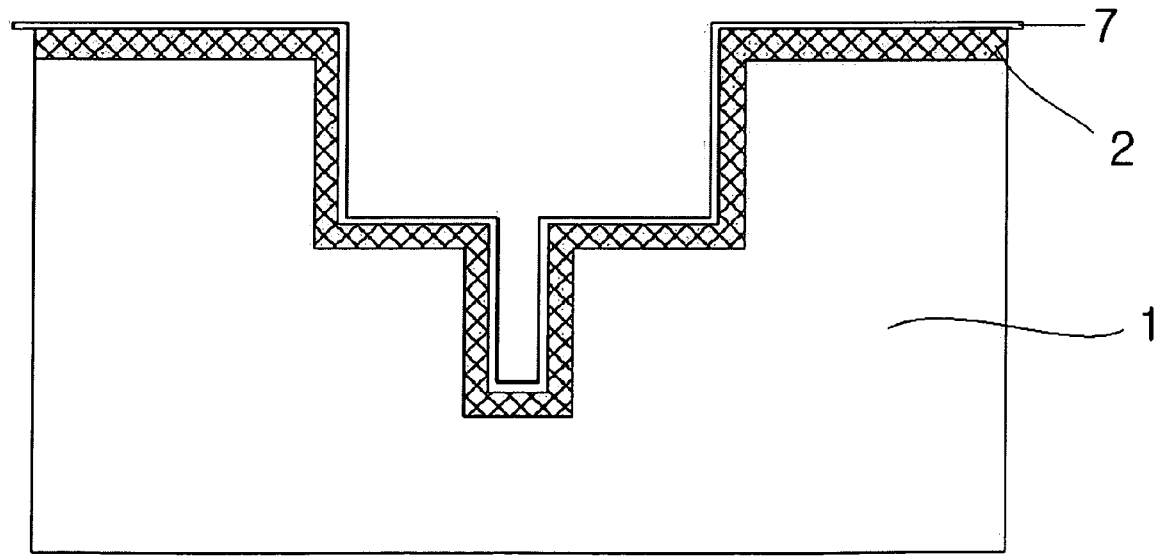
FIG. 4 schematically shows, in a cross-sectional view, the final Ag seed layer deposited by the sliver mirror reaction.

Referring to FIG. 4, the Ag seed layer 7 is formed on the barrier metallic layer 2 through a heating process. Here, the Ag seed layer 7 prevents Cu diffusion.

Figure 5:
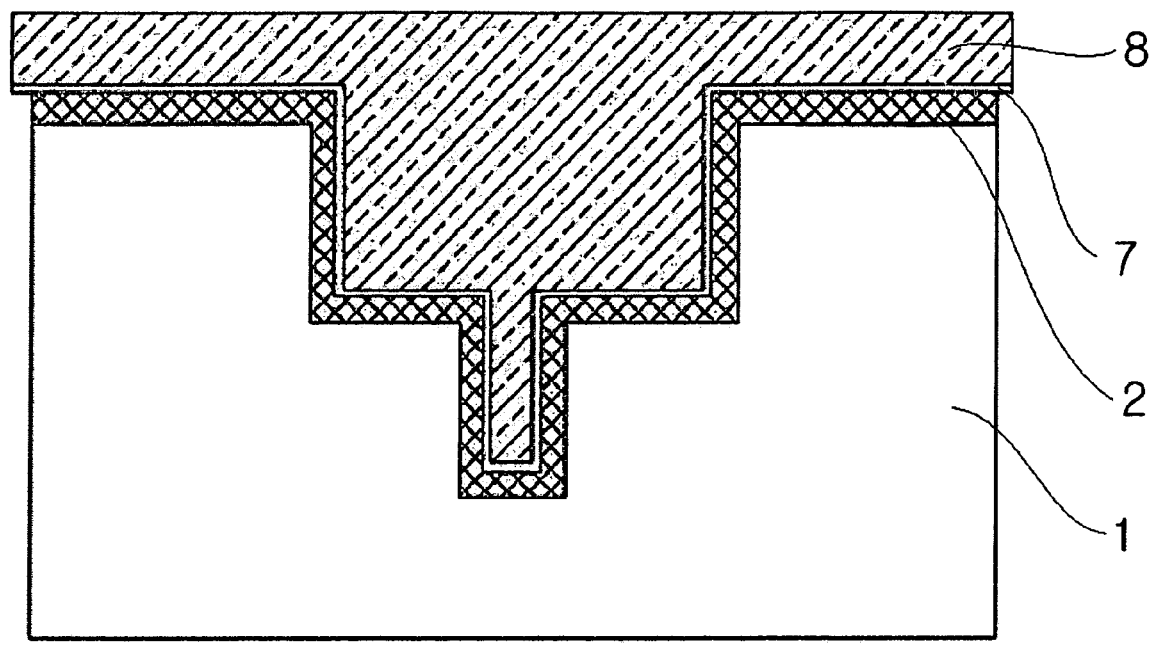
FIG. 5 schematically illustrates, in a cross-sectional view, a Cu seed layer formed in an ECP process.

Referring to FIG. 5, a Cu layer 8 is plated by using the Ag seed layer through an ECP process.

Figure 6:
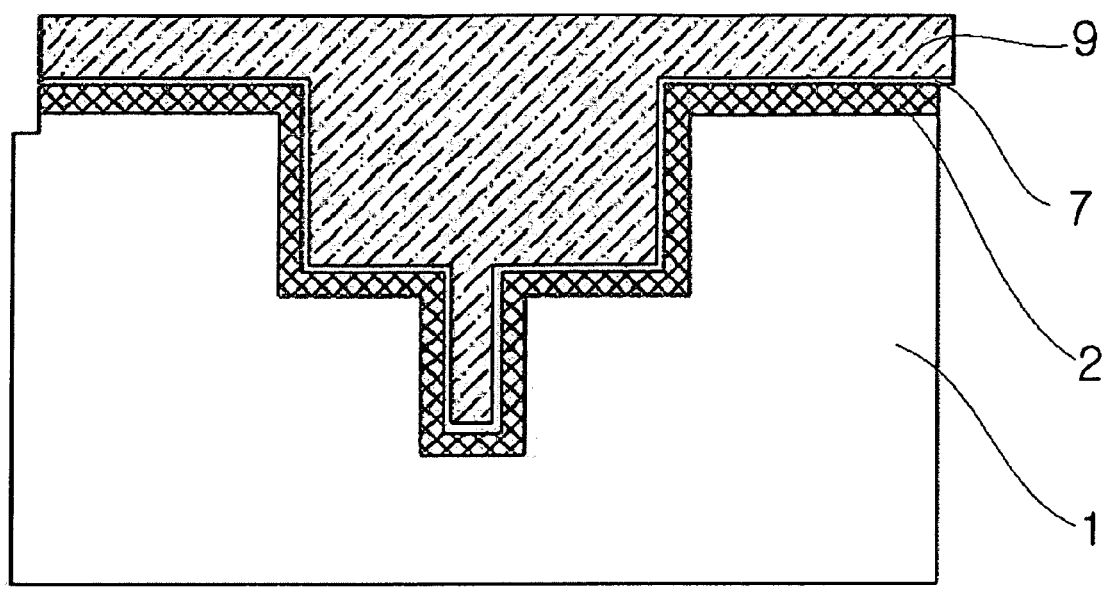
FIG. 6 schematically shows, in a cross-sectional view, a final Cu interconnect line.

Referring to FIG. 6, the final Cu interconnect line 9 is formed through an annealing process and a Cu CMP process for obtaining a thermal stability.

The method for fabricating a semiconductor device according to the present invention provides the improvement of uniformity by forming a seed layer with low-resistivity regardless of a low thickness of the seed layer in order to avoid a terminal effect in an ECP process.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method for fabricating a semiconductor device, comprising:
   (a) depositing a barrier metal layer on a damascene pattern on a wafer;
   (b) forming an Ag seed layer on the barrier metal layer in a reactor, by a process comprising:
      immersing the wafer having the barrier metal layer thereon into a solution including $NH_3$ and $AgNO_3$;
      performing a heating process to react a surface of the wafer with the solution and a reductive material; and
      rotating the wafer during the heating process;
   (c) plating a Cu layer on the Ag seed layer through an ECP process; and
   (d) forming a Cu interconnect by annealing the wafer and polishing the wafer with the Cu layer thereon by a Cu CMP process.

2. The method as defined in claim 1, further comprising providing the reductive material and the solution of $AgNO_3$ and $NH_3$ by a batch bath.

3. The method as defined in claim 1, wherein the reductive material comprises sucrose.

4. The method as defined in claim 1, comprising providing the reductive material and the solution of $AgNO_3$ and $NH_3$ by a dispense method.

5. The method as defined in claim 1, wherein the method minimizes a terminal effect in the ECP process.

6. The method as defined in claim 1, further comprising forming the damascene pattern by an etching process.

7. The method as defined in claim 1, wherein the wafer is rotated at a predetermined RPM.

8. The method as defined in claim 1, wherein the seed layer has low resistivity.

9. The method as defined in claim 1, wherein forming the seed layer comprises a silver mirror reaction.

10. The method us defined in claim 1, wherein the seed layer has substantial uniformity.

* * * * *